US010972109B2

(12) United States Patent
Kundu et al.

(10) Patent No.: US 10,972,109 B2
(45) Date of Patent: Apr. 6, 2021

(54) SUB SAMPLING PHASE LOCKED LOOP (SSPLL) WITH WIDE FREQUENCY ACQUISITION

(71) Applicant: Apple Inc., Cupertino, CA (US)

(72) Inventors: Somnath Kundu, Hillsboro, OR (US); Stefano Pellerano, Beaverton, OR (US); Abhishek Agrawal, Beaverton, OR (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/126,722

(22) Filed: Sep. 10, 2018

(65) Prior Publication Data

US 2020/0083892 A1 Mar. 12, 2020

(51) Int. Cl.
| H03L 7/08 | (2006.01) |
| H03L 7/087 | (2006.01) |
| H03L 7/099 | (2006.01) |
| H03L 7/113 | (2006.01) |

(52) U.S. Cl.
CPC ............ H03L 7/087 (2013.01); H03L 7/0992 (2013.01); H03L 7/113 (2013.01)

(58) Field of Classification Search
CPC ......... H03L 7/087; H03L 7/113; H03L 7/0992
See application file for complete search history.

(56) References Cited

U.S. PATENT DOCUMENTS

| 5,302,916 A * | 4/1994 | Pritchett | H03L 7/089 327/107 |
| 5,950,115 A * | 9/1999 | Momtaz | H03L 7/07 327/147 |
| 6,331,792 B1 * | 12/2001 | Tonietto | H03L 7/087 327/48 |
| 7,737,743 B1 | 6/2010 | Gao | |
| 10,411,716 B2 | 9/2019 | Chen | |
| 2013/0005276 A1 * | 1/2013 | Van Driest | H03L 7/06 455/76 |

OTHER PUBLICATIONS

Gao, Xiang et al. "A Low Noise Sub-Sampling PLL in Which Divider Noise is Eliminated and PD/CP Noise is Not Multiplied by N2." IEEE Journal of Solid-State Circuits, vol. 44, No. 12, Dec. 2009. 11 pages.
Hsu, Chun-Wei et al. "A Sub-Sampling Assisted Phase-Frequency Detector for Low-Noise PLLs with Robust Operation Under Supply Interference." IEEE Transactions on Circuits and Systems—I: Regular Papers, vol. 62, No. 1, Jan. 2015. 10 pages.
International Search Report and Written Opinion dated Oct. 28, 2019 in connection with International Application PCT/US2019/043213.

* cited by examiner

*Primary Examiner* — Kabir A Timory
(74) *Attorney, Agent, or Firm* — Eschweiler & Potashnik, LLC

(57) ABSTRACT

A sub-sampler phase locked loop (SSPLL) system having a frequency locking loop (FLL) and a phase locked loop (PLL) is disclosed. The FLL is configured to detect frequency variations between a phase locked loop (PLL) output signal and a reference frequency and automatically generate a pulsed correction signal upon the detected frequency variations and apply the pulsed correction signal to a voltage controlled oscillator (VCO) control voltage. The PLL is configured to generate the PLL output signal based on the VCO control voltage.

16 Claims, 15 Drawing Sheets

SUB SAMPLING PHASE LOCKED LOOP (SSPLL) WITH WIDE FREQUENCY ACQUISITION

FIELD

Various embodiments generally relate to the field of wireless communications.

BACKGROUND

Phase locked loops (PLLs) are an important building block for wireless communications and other communications. PLLs are used in communication circuitry for demodulation, locking frequencies, and the like. Also, millimeter-wave (mmWave) frequencies are used for wireless communications and the like. The mmWave frequencies can be used to provide high data rate communications for various applications.

However, mmWave communications have a large frequency range and operate at high frequency. PLLs can be challenged by operating at these mmWave frequencies. The PLLs can have difficulty locking onto frequencies and the like.

What are needed are techniques to facilitate PLL operation at mmWave frequencies and facilitate wireless communications.

DETAILED DESCRIPTION

Figure 1:
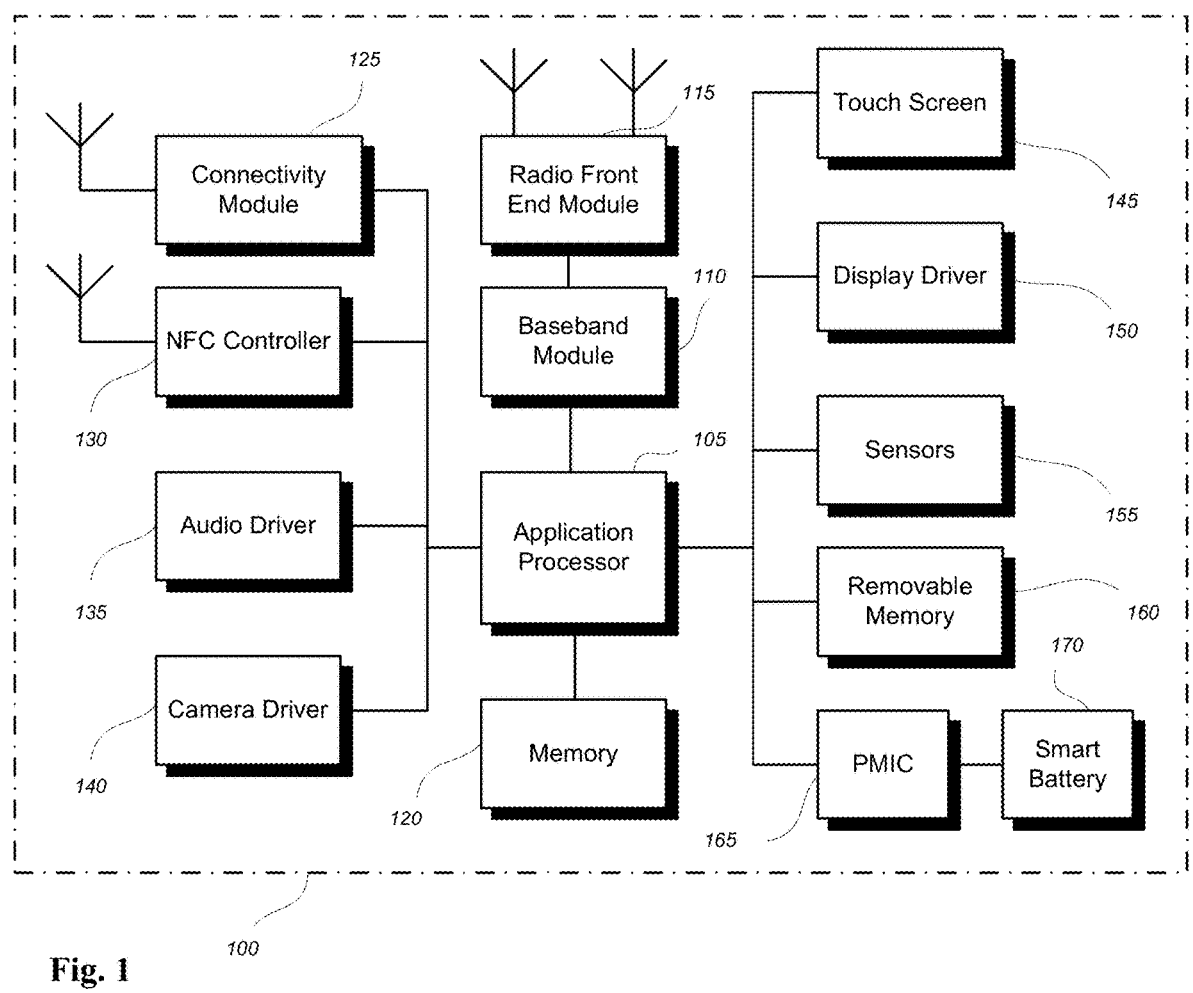
FIG. 1 illustrates a user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1 and 5G.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Wireless communication in mm-wave frequency spectrum (generally >30 giga-hertz (GHz)) typically requires very low noise on-chip phase locked loop (PLL). However, it is appreciated that noise suppression at such high frequencies increase the PLL power consumption significantly due to the low tank quality factor. Moreover, dividers in a feedback path have to operate at mmWave frequencies of the voltage controlled oscillator (VCO) and can substantially increase the overall LO power consumption. Therefore, a sub-sampling technique is utilized which can significantly suppress the in-band phase noise of the PLL and, at the same time, does not require a frequency divider in the feedback path, hence reducing overall power consumption.

However, sub-sampling PLLs (SSPLLs) generally suffer from limited frequency acquisition range due to the sinusoidal characteristic (input phase error vs output voltage) of the sub-sampling phase detector. Thus, the SSPLL is unable to lock if input frequency error is too large. As a result, an additional frequency tracking loop is typically required, reintroducing the need of high-frequency, power-hungry clock dividers.

Embodiments are disclosed that utilize a low frequency alias signal provided by a sub-sampling phase detector to implement a frequency locking loop. As a result, a wideband frequency tracking circuit is implemented without a dedicated frequency divider. This permits the SSPLL to operate across phase/frequency errors without using a high-frequency clock divider and its high power consumption.

FIG. 1 illustrates a user device 100 in accordance with an aspect. The user device 100 may be a mobile device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
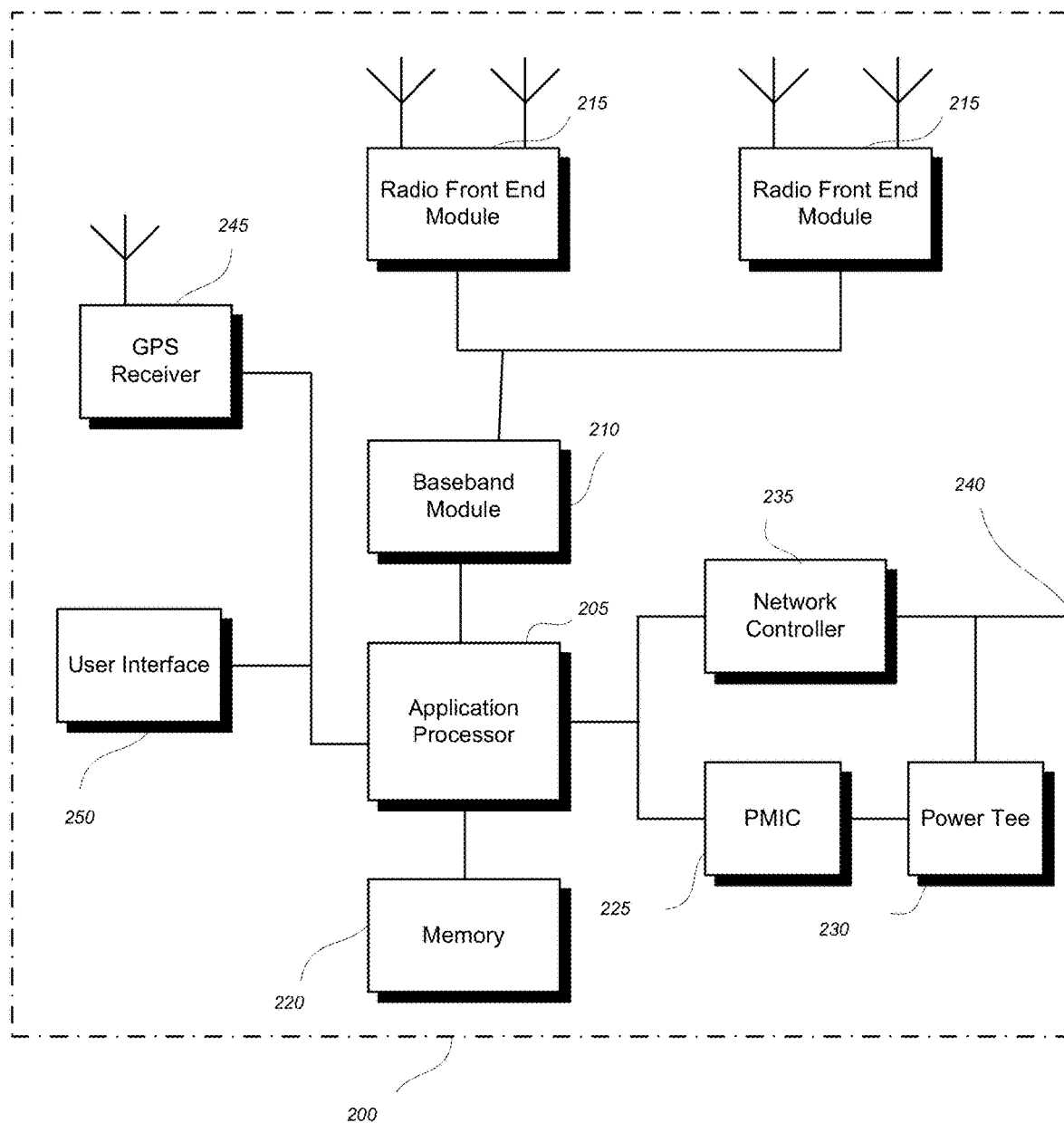
FIG. 2 illustrates a base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

Figures 3A, 3B:
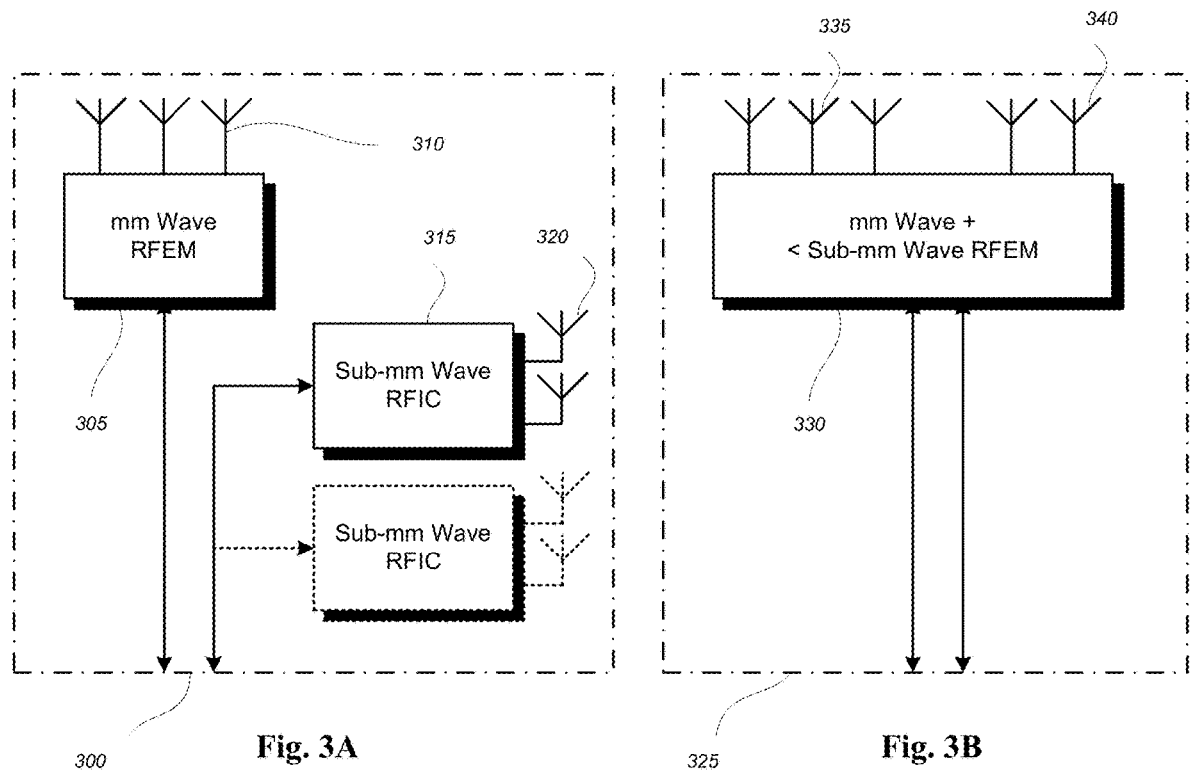
FIG. 3A and FIG. 3B illustrate aspects of a radio front end module.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
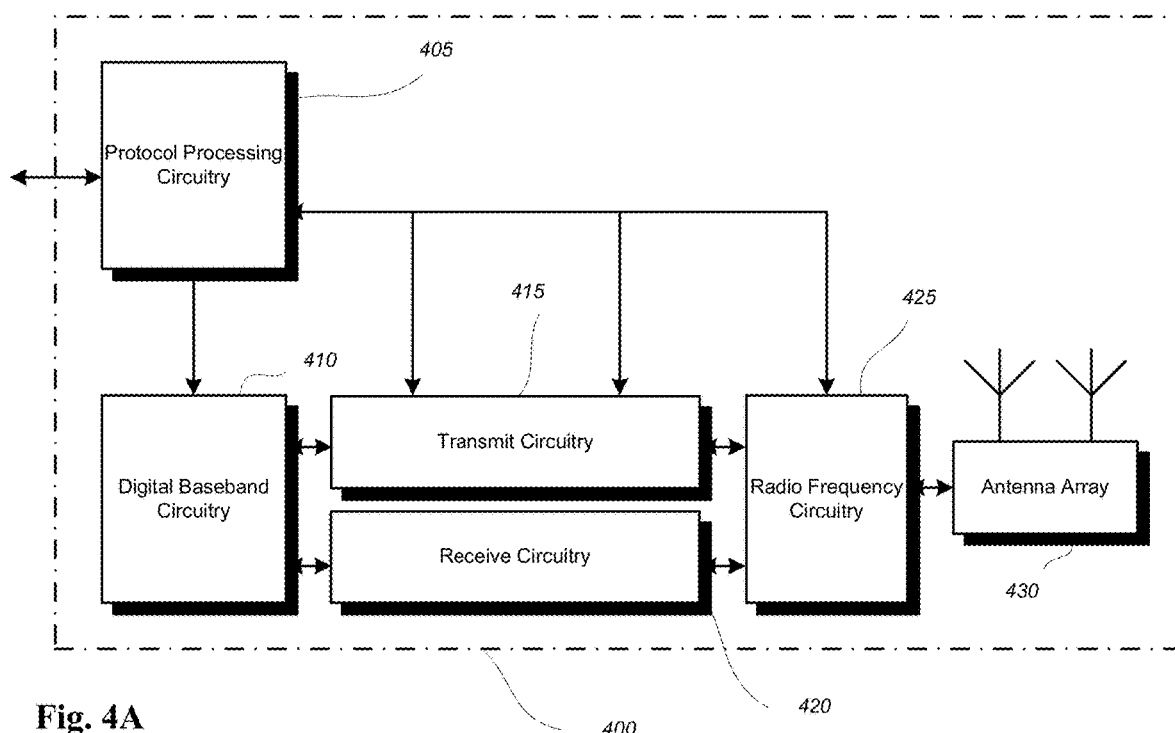
FIG. 4A illustrates an exemplary millimeter wave communication circuitry 400 according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
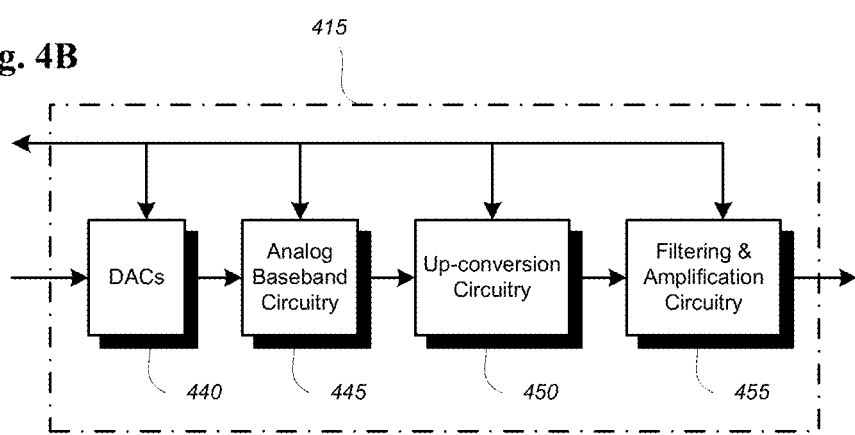
FIGS. 4B and 4C illustrate examples for transmit circuitry in FIG. 4A in some aspects.
Figure 4C:
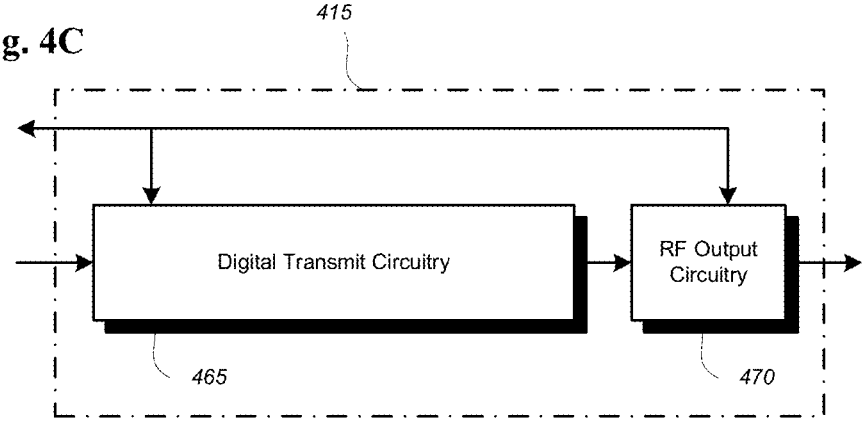

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, 4C illustrates an exemplary transmit circuitry 415 which includes digital transmit circuitry 465 and output circuitry 470.

Figure 4D:
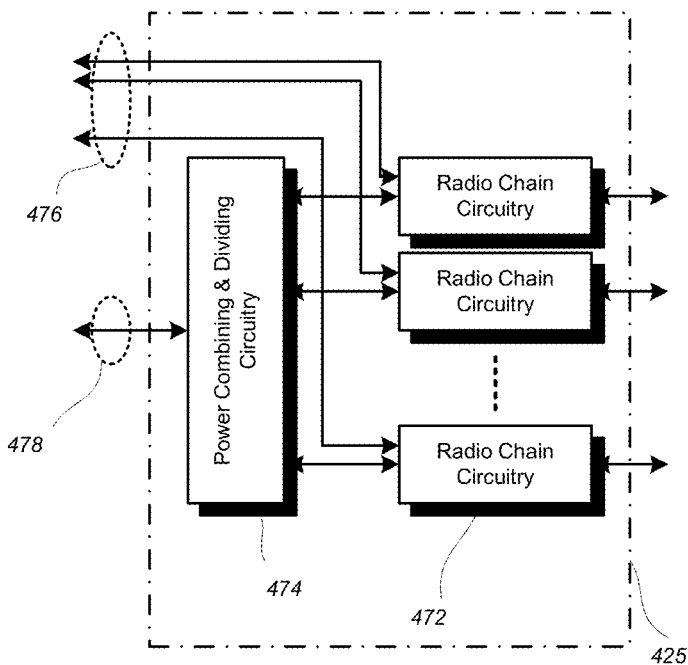
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may one or more include wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

The transmit circuitry 415 and/or the receive circuitry 520 can include a PLL or SSPLL. For example, the transmit circuitry 415 can include an SSPLL for up-conversion and the receive circuitry 420 can include an SSPLL for down-conversion.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
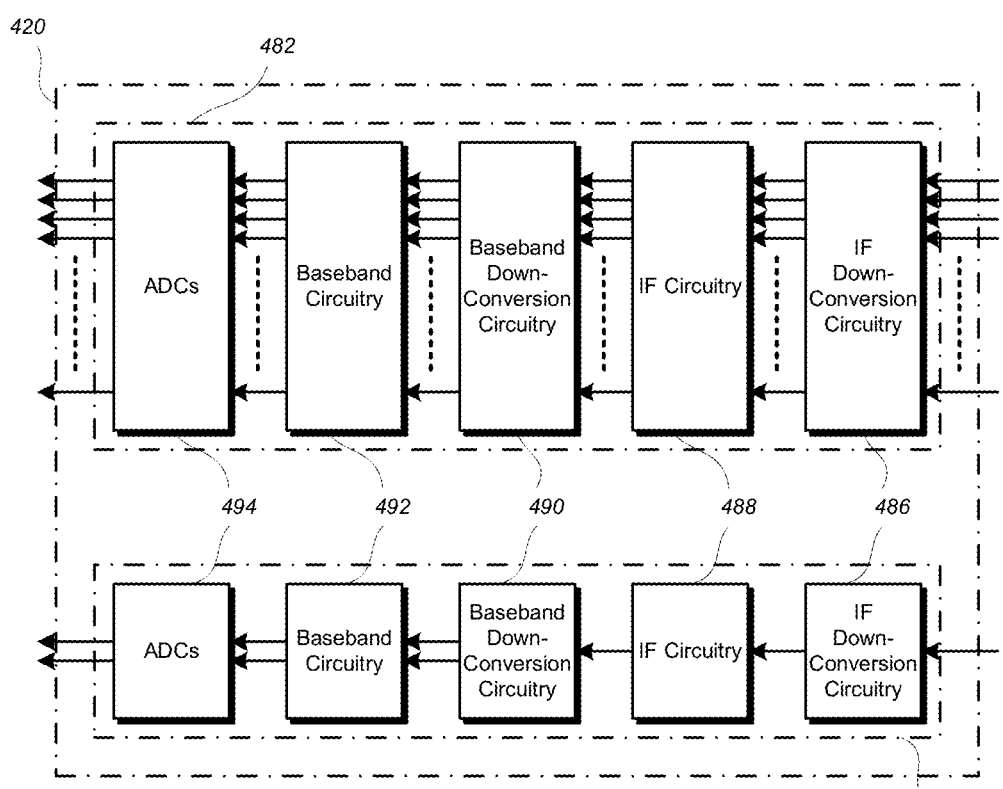
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

Figure 5:
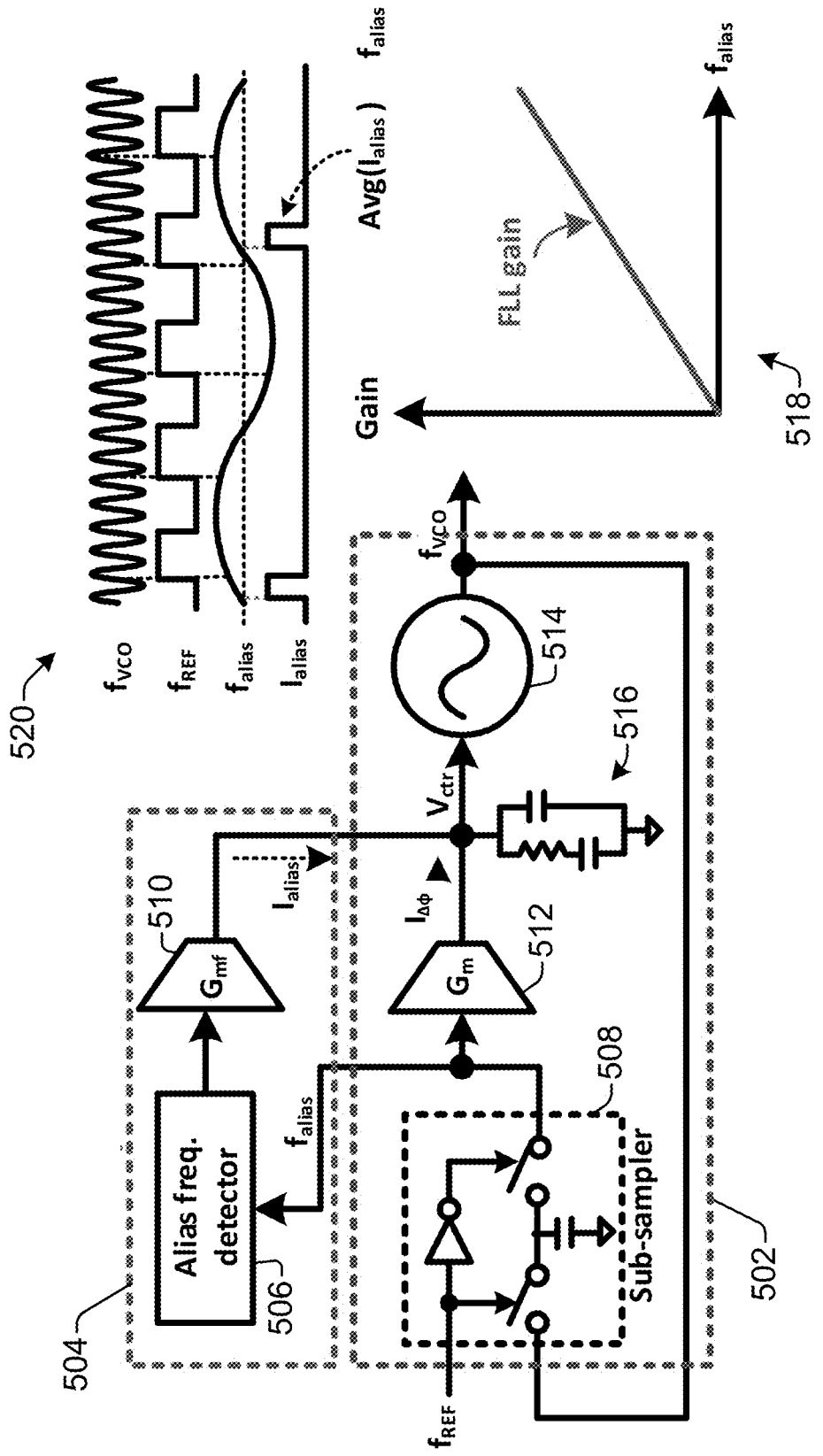
FIG. 5 is a diagram illustrating an arrangement for a sub-sampling phase locked loop (SSPLL) system in accordance with some embodiments and/or aspects.

FIG. 5 is a diagram illustrating an arrangement for a sub-sampling phase locked loop (SSPLL) system 500 in accordance with some embodiments and/or aspects. The system 500 includes a frequency locked/locking loop (FLL) that facilitates wide frequency acquisition, including mmWave frequencies, while mitigating power consumption.

The mmWave frequencies generally include greater than about 30 GHz and can include 28 GHz, 38 GHz, 70-85 GHz, 90-95 GHz and the like.

The system 500 is provided as a simplified schematic for illustrative purposes and can be implemented in a baseband module or baseband circuitry, such as the baseband module 110 or 210, described above.

The system 500 includes a PLL 502 and a FLL 504. The general operation of the system 500 is described as follows. The PLL 502 generates an output frequency $f_{VCO}$ from a reference frequency $f_{REF}$. The PLL 502 provides a frequency error signal, $f_{alias}$ to the FLL 504. The FLL generates a frequency error correction signal $I_{alias}$ based on the frequency error signal. The system 500 can be configured to operate on differential signals.

The FLL 504 is automatically activated when there is a frequency error ($f_{alias}>0$) and is deactivated when the frequency error is not present ($f_{alias}=0$), during steady state under phase-locked conditions.

The PLL 502 includes a sub-sampler based phase detector 508, a gain circuit 512, analog filter 516 (also referred to as logic or circuitry) and a voltage controlled oscillator 514.

The sub-sampler 508 receives a reference frequency ($f_{REF}$) and a VCO frequency ($f_{VCO}$) and generates an alias frequency ($f_{alias}$) based on its inputs. The alias frequency is provided at its output. A PLL gain circuit 512 generates a phase difference current $I_{\Delta\varphi}$ based on the alias frequency $f_{alias}$ and the reference clock $f_{REF}$. A summation circuit, located between the gain circuit 512 and the VCO 514, combines the phase difference current $I_{\Delta\varphi}$ with the frequency correction current $I_{alias}$ to generate a tuning control signal or tuning voltage $V_{ctr}$.

The analog filter circuit 516 generates the tuning voltage $V_{ctr}$. In one example, the circuit 516 includes a first parallel path having a resistor and a first capacitor and a second parallel path having a capacitor. The values for the components of the circuit 516 can be selected to mitigate noise and the like on the tuning voltage $V_{ctr}$. It is appreciated that other suitable filter circuits and the like can be utilized in place of the filter/circuit 516.

The VCO 514 generates a frequency output signal $f_{VCO}$ based on the tuning voltage $V_{ctr}$. In this example, the tuning voltage $V_{ctr}$ can be phase locked and frequency locked due to the phase difference current $I_{\Delta\varphi}$ and the frequency correction current $I_{alias}$. Thus, the output signal $f_{VCO}$ is phase locked and frequency locked without a divider being used in the system 500.

The FLL 504 includes an alias frequency detector 506 and an FLL gain circuit 510 ($G_{mf}$). The frequency detector 506 receives the alias frequency (or frequency error) and generates pulse current signal $I_{alias}$, also referred to as a frequency correction signal. The average value of $I_{alias}$ is proportional to the frequency error $f_{alias}$.

If the VCO frequency is $f_{VCO}$ and reference frequency is $f_{REF}$, the alias frequency at the sub-sampler output is $f_{alias}=|f_{VCO}-Nf_{REF}|$. The value N is based on a free running frequency of the VCO 514 at start-up of the system 500. The free running frequency can be coarsely calibrated once and then stored on chip, in one example.

Some suitable examples of N are 10, 5 and the like.

The frequency detector 506 can include a counter (not shown), which can be used to measured $f_{alias}$. The measurement by the frequency detector 506 is provided to the gain circuit 510. The frequency detector 506 can also include a polarity detector configured to determine a direction for the correction signal. Examples of suitable polarity detector(s) are provided below.

The FLL 504 generates the frequency correction signal in the form of current pulses ($I_{alias}$). The correction signal is injected into the loop filter/circuit 516, which adjusts the VCO frequency so that $f_{alias}$ is zero in steady state.

The counter, and by extension the frequency detector 506, has low power consumption because f is generally much smaller than $f_{vco}$ and is most equal to $f_{REF}/2$. For example, $f_{vco}=24$ GHz, with $f_{REF}=2.4$ GHz and N=10, resulting in a max $f_{alias}$ of 1.2 GHz. This frequency is 20× smaller than the frequency of a typical FLL divider running at $f_{vco}$.

As stated above, the gain circuit 510 generates the frequency correction signal ($I_{alias}$) based on the measurements provided by the frequency detector 506. The average current generated at the output of the FLL, $I_{alias}$, is proportional to $f_{alias}$. Therefore, a large frequency error $f_{alias}$ generates high frequency correction signal $I_{alias}$, which effectively increases the FLL loop gain for faster settling. On the other hand, when $f_{alias}$ is very small, the FLL loop gain is very low and eventually becomes zero when VCO frequency is locked ($f_{alias}=0$). Therefore, the FLL doesn't contribute noise or additional power consumption in steady state condition. Thus, the during phase locked condition or steady state, the VCO tuning voltage (Vctr) is only controlled by the phase difference ($\Delta\varphi$) between the reference and the VCO signal, shown as $I_{\Delta\varphi}$.

The gain of the FLL 504 is shown at 518 as the FLL gain. It is appreciated that the gain increases as the alias frequency $f_{alias}$ increases.

Some example signals are shown at 520. $f_{VCO}$ is the output signal of the PLL 502. $f_{REF}$ is the reference signal input to the PLL 502. $f_{alias}$ is the frequency error signal provided to the FLL 504. $I_{alias}$ is the frequency correction generated by the FLL 504. The frequency correction $I_{alias}$ signal is shown having pulses that start when the frequency error $f_{alias}$ increases above zero. The pulses of $I_{alias}$ have a relatively short duration, such as less than a wavelength in one example.

Thus, the system 500 generates an output signal/frequency $f_{VCO}$ that can be phase locked and frequency locked without requiring a frequency divider. It is noted that a frequency divider typically consumes about as much power as a VCO. Thus, not having a frequency divider in the system mitigates power consumption.

Additionally, the FLL 504 is automatically activated or turned on only when there is a frequency error detected in the alias frequency signal $f_{alias}$. Thus, the FLL 504 can mitigate power consumption by only being ON or activated when there is frequency error. When the measured or detected frequency error is zero, the FLL 504 is OFF or deactivated. The FLL 504 operates or is activated whenever there is measured or detected frequency error.

Also, unlike other approaches, there is not distinct loops, such as where a frequency lock occurs and then a phase lock, which can introduce instability. The approach used by the system 500 mitigates the instability by the FLL 504 working in conjunction with the PLL 502.

The system 500 facilitates the use of SSPLL for mmWave frequency synthesis without requiring a high frequency clock divider for the FLL loop. This reduces power consumption and complexity, especially within the mmWave range.

Additionally, the system 500 does not require a frequency detector, which reduces a load capacitance for the VCO, which can improve VCO tuning range without additional power consumption. This facilitates covering several wireless frequency bands with the shame synthesizer, thereby reducing silicon area used and reducing cost.

The FLL is automatically de-activated once a phase locked condition is obtained and is automatically activated if there is drift in the VCO frequency. This automatic operation simplifies implementation without impacting the PLL operation and mitigates unexpected frequency errors.

Figure 6:
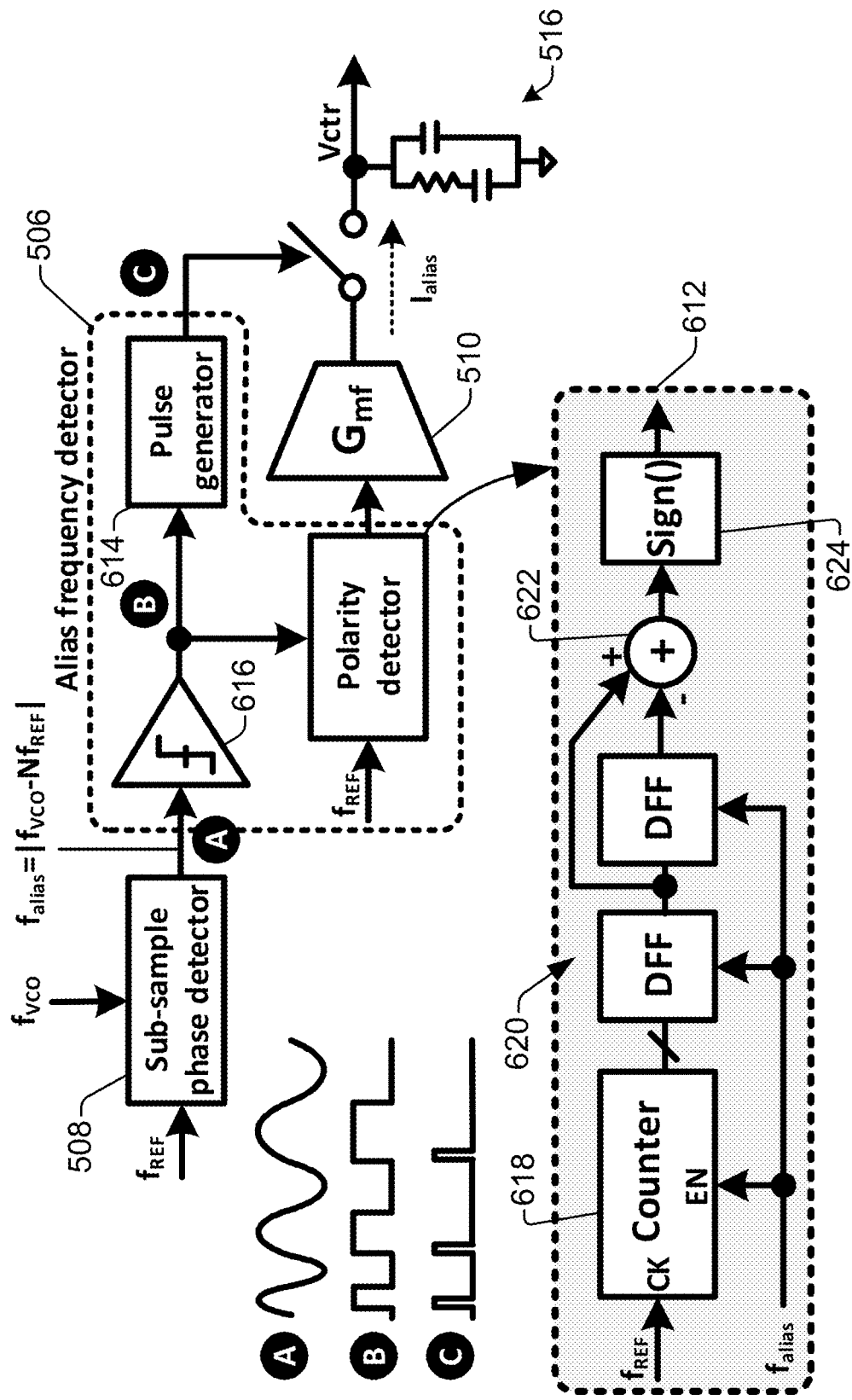
FIG. 6 is a diagram illustrating an arrangement for a frequency locking loop (FLL) for use with a sub-sampling phase locked loop (SSPLL) system in accordance with some embodiments and/or aspects.

FIG. 6 is a diagram illustrating an arrangement for a frequency locking loop (FLL) 600 for use with a sub-sampling phase locked loop (SSPLL) system in accordance with some embodiments and/or aspects. The FLL 600 facilitates wide frequency acquisition, including mmWave frequencies, while mitigating power consumption.

The FLL 600 is provided as a simplified schematic for illustrative purposes and can be implemented in a baseband module or baseband circuitry, such as the baseband module 110 or 210, described above.

The FLL 600 includes an alias frequency detector 506 and a gain circuitry 510. The FLL 600 can be used as the FLL 504 in the system 500, as an example.

The alias frequency detector 506 includes a comparator 616, a pulse generator 614 and a polarity detector 612.

A sub-sample phase detector of a SSPLL samples and generates a subsample signal based on a reference frequency and a VCO output signal. An example of the subsample signal is shown as 'A' in FIG. 6.

The comparator 616 generates a rail to rail signal based on the subsample signal. The rail to rail signal is generated having peak values and minimum/low values. An example of a generated rail to rail signal is shown as 'B' in FIG. 6.

The pulse generator 614 generates a pulsed signal having pulses fixed duration based on the rail to rail signal. The pulses begin at rising edges of the subsample signal. An example of the pulsed signal is shown as 'C' in FIG. 6.

Each pulse of the pulsed signal activates the gain circuitry 510, also referred to as Gm cell, to inject a fixed amount of charge into the loop filter/logic circuit 516. This injected charge increases or decreases the tuning voltage $V_{ctr}$ in order to achieve frequency locking. However, the $f_{alias}$ does not have frequency polarity information, which is whether $f_{VCO}$ is higher or lower than $Nf_{REF}$.

Polarity information is typically used to tune $V_{ctr}$ in the correct or proper direction. The polarity detector 612 detects and generates a polarity signal based on the rail to rail signal provided by the comparator 616.

The polarity detector 612 includes a counter 618, one or more D flip flops (DFFs) 620, a digital subtractor 622 and a sign circuitry 624. In one example, the counter 618 is an 8 bit counter. The FLL 600 and the detector starts the operation with a guessed sign and observes the change in $f_{alias}$. A gradual decrease in $f_{alias}$ implies a correct polarity of $I_{alias}$ injection into the loop filter/logic 516

The counter 618 counts a number of reference cycles in a given $f_{alias}$ period. Thus, the counter 618 generates a count value proportional to $f_{REF}/f_{alias}$. The change in $f_{alias}$ is observed by subtracting the counter outputs for two consecutive cycles. These values can be stored in DFFs as shown. The digital subtractor 622 determines whether $f_{alias}$ is f increasing or decreasing and maintains the polarity if $f_{alias}$ has decreased or changes/reverses the polarity if $f_{alias}$ has increased, based on the store count values in the DFFs 620. In this example, the counter values for two consecutive cycles are used. The output of the digital subtractor 622 is provided to the sign circuitry, which sets a polarity sign. The polarity sign is provided to the gain circuit to set the direction of the frequency adjustment $I_{alias}$. It is appreciated that other suitable polarity detectors and/or implementations are contemplated, such as the polarity detector 1112 described below.

Figure 7:
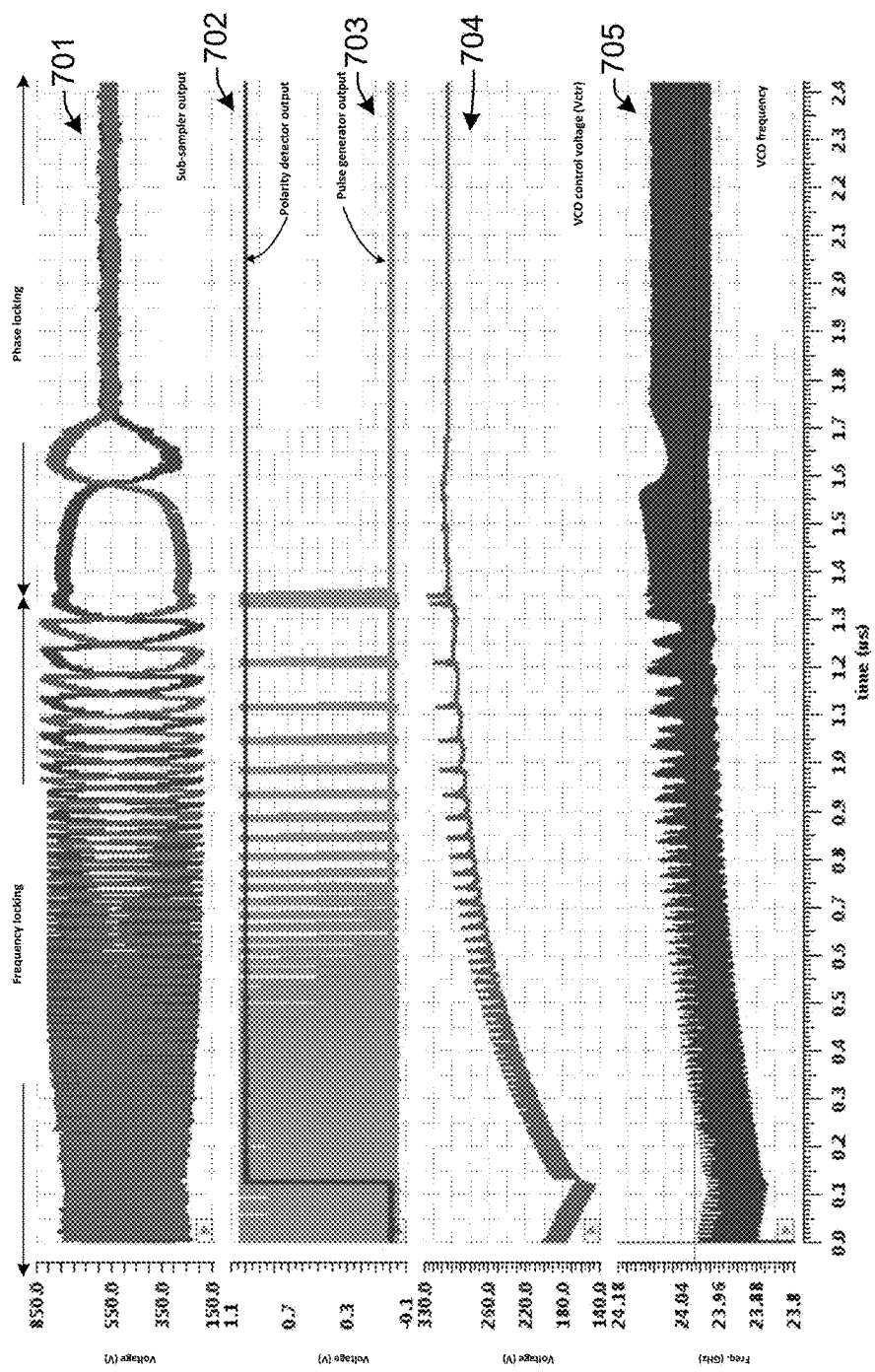
FIG. 7 is a graph showing example signal for a SSPLL in accordance with some embodiments.

FIG. 7 is a graph showing example signal for a SSPLL in accordance with some embodiments. The signals are provided for illustrative purposes and it is appreciated that other signals and variations are contemplated and in accordance.

The graph shows transistor level simulation results of a wide frequency acquisition SSPLL, such as the system 500 described above.

The graph depicts time increasing along an x-axis and frequency or voltage along a y-axis (as shown). The graph depicts operation of the SSPLL having a frequency locking portion and a phase locking portion.

A first signal at 701 is the subsampler signal generated by the subsampler. The subsampler signal 701 is a differential output, which is converted to pulses by the pulse generator, as described above. The signal 701 switches very fast initially during the frequency locking portion, but decrease at the end of the frequency locking portion. In the phase locking portion, the values of the signal 701 settle as shown.

A second signal 702 is the polarity detector signal output by the polarity detector. A pulse signal 703 is shown with the polarity detector signal 702.

A third signal 704 is the VCO tuning voltage. It also changes fast initially due to large frequency error and eventually settles after phase locking.

A fourth signal 705 is the VCO frequency or SSPLL output signal. Here it can be seen that the signal 705 changes until a point of time in the phase locking portion. It can be seen that the polarity detector signal 702 switches or reverses polarity after a short period and then stays at that polarity for the remaining duration. The polarity detector signal 702 is initially set to 0, which injects negative $I_{alias}$ to the loop filter to decrease $V_{ctr}$ 704. However, this correction signal causes f to gradually increase, instead of reducing. The polarity detector detects this increase and reverses the direction of injection from negative to positive in order to tune $V_{ctr}$ 704 in the correct/proper direction. As $f_{alias}$ decreases, the rate of injection of $I_{alias}$ also decreases/reduces, thereby decreasing the FLL gain. Once $f_{alias}$ is sufficiently small, i.e., such that a phase difference between the reference and the $f_{VCO}$ 705 falls within the detection range of the sub-sampler, the phase locking loop takes over and mitigates or cancels remaining phase error. When $f_{alias}=0$, the SSPLL is in the phase locked condition and the FLL remains substantially idle, OFF, or deactivated. However, any fast transient drift in the VCO output signal 705 frequency, such as due to voltage fluctuations, can cause a frequency error at the sub-sampler, which automatically activates the FLL for a recovery.

Figure 8:
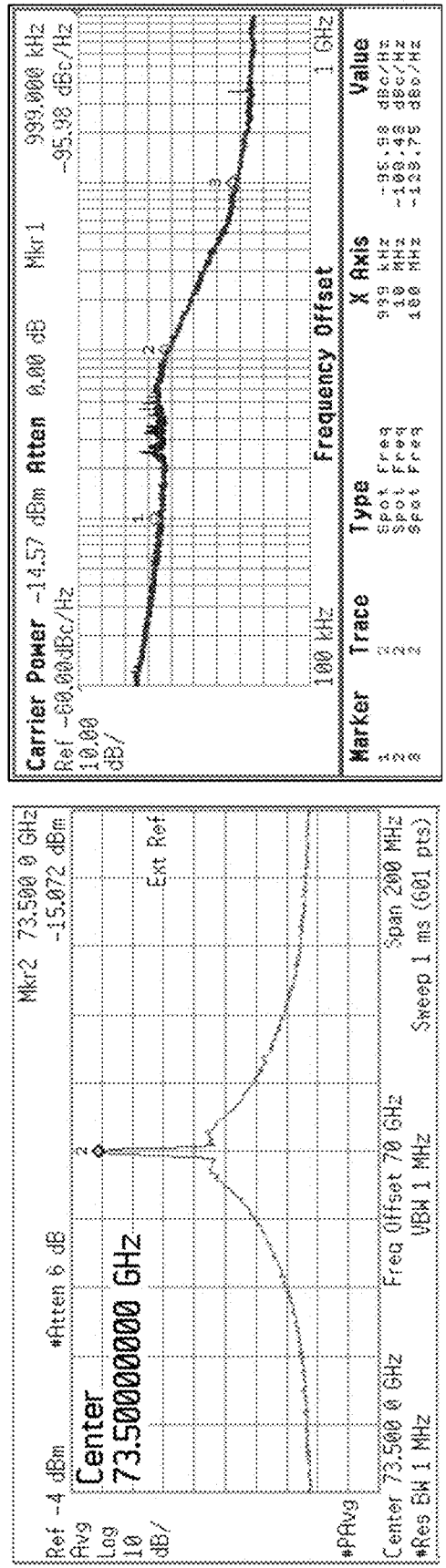
FIG. 8 depicts graphs of an example measured output spectrum and phase noise in accordance with some embodiments.

FIG. 8 depicts graphs of an example measured output spectrum and phase noise in accordance with some embodiments. The graphs are provided as an example for illustrative purposes. It is appreciated that output spectrum and/or phase noise can vary.

The graphs are based on an example SSPLL in accordance with the system 500. In this example, a test chip having the example SSPLL is fabricated in 22 nm FinFET process. The measurements are lab measurements.

The graphs includes a measured spectrum output graph 802 and a phase noise graph 804. An input frequency, $f_{REF}$ for the PLL is 2.45 giga hertz (GHz) to generate an output, $f_{VCO}$ of 24.5 GHz. A frequency tripler connected to an output of the PLL generates a 73.5 GHz local oscliaotor (LO) signal. The LO output signal frequency can be tuned continuously from 71 GHz to 76 GHz.

Figure 9:
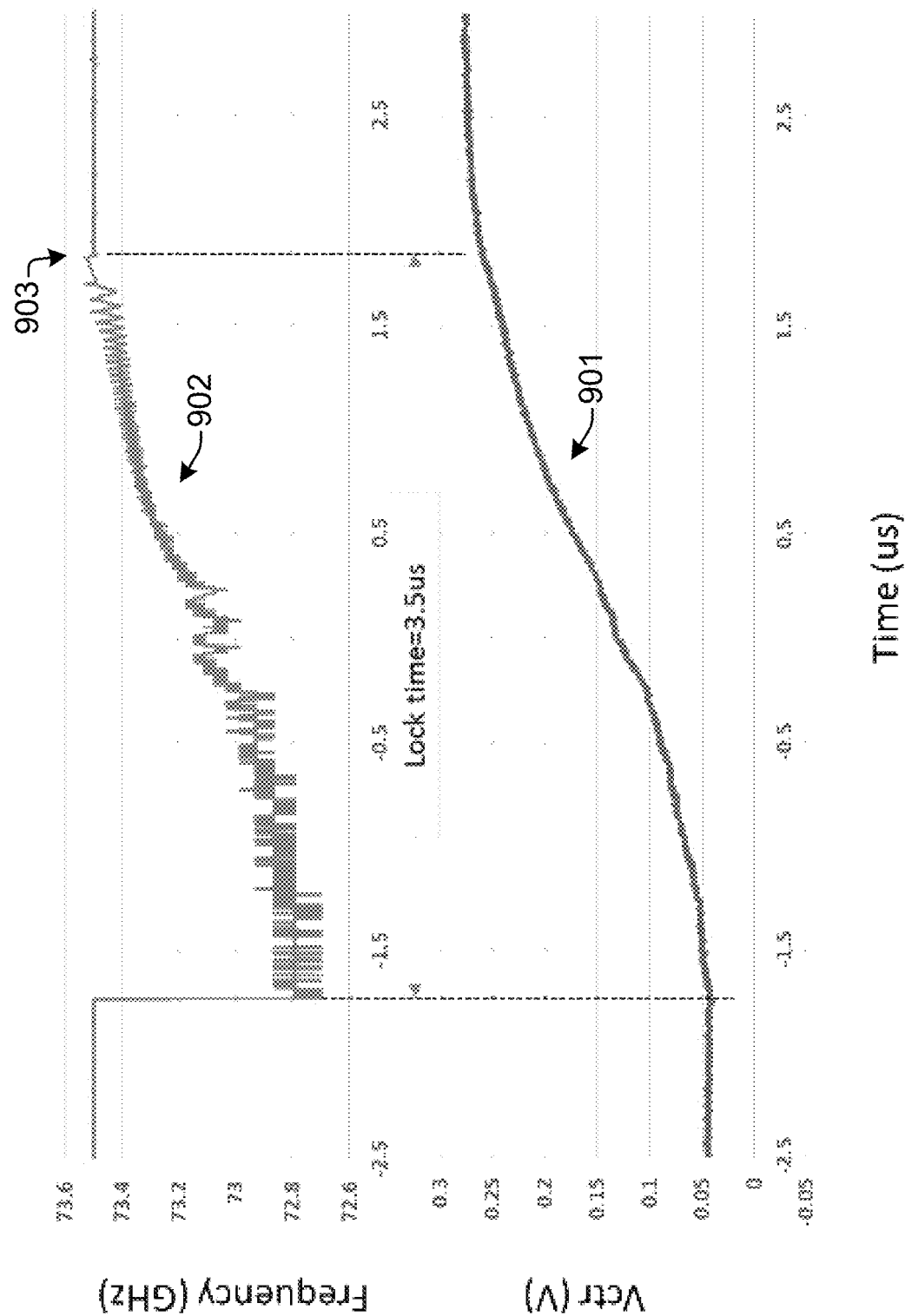
FIG. 9 is a graph that depicts a measured output frequency and VCO tuning voltage during a step in VCO free running frequency.

FIG. 9 is a graph 900 that depicts a measured output frequency and tuning voltage $V_{ctr}$ or VCO control voltage during a step in VCO free running frequency.

The graph 900 depicts operation of the example SSPLL described above with regard to FIG. 8.

An x-axis depicts time increasing from left to right. A y-axis depicts frequency increasing from bottom to top. A VCO control voltage Vctr is shown at 901 and a PLL or VCO output signal $f_{VCO}$ is shown at 902.

A sudden drop in the VCO frequency of the $f_{VCO}$ 902 triggers or automatically activates the FLL (such as the FLL 504). The FLL and the SSPLL are able to recover the frequency with 3.5 micro seconds, in this example at 903. It is appreciated that the frequency recovery time can vary.

The recovery is obtained by the operation of the FLL and resulting adjustment to the control voltage $V_{ctr}$ 901.

It is appreciated that other types of polarity detectors can be used instead of or in addition to the polarity detector 612 described above.

In one example, in-phase (I) and quadrature (Q) components of the alias frequency can be used to facilitate polarity detection.

Both in-phase and quadrature phase/component of the alias clock are generated at the sub-sampler output. In other approaches, only the quadrature phase/component is used.

The polarity detector can be simpler using I and Q instead of using one. The detector using I and Q can be implemented as a 1-bit phase detector instead a digital counter. Polarity detection can be performed faster.

A FLL using the I and Q polarity detector also includes a coarse tuning loop that adjusts the VCO coarse frequency over a wider range. The VCO coarse tuning loop can also be used with other polarity detectors to have the wider range.

Figure 10:
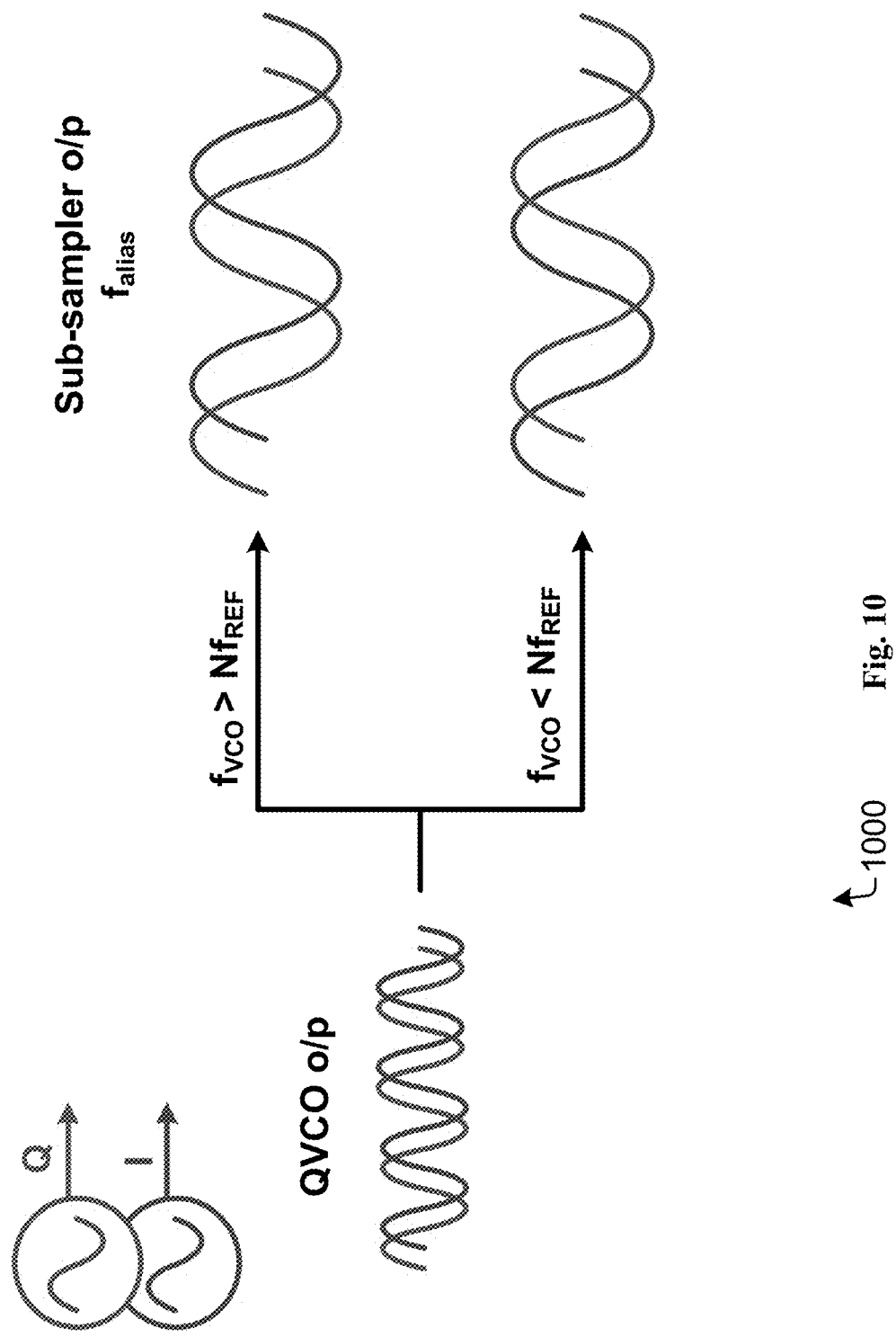
FIG. 10 shows an alternative technique for fast polarity detection for a quadrature phase VCO.

FIG. 10 is a diagram 1000 depicting I and Q phase(s)/components of an alias frequency signal in accordance with some embodiments or aspects. The diagram 1000 is provided for illustrative purposes.

The alias frequency signal can be a differential signal with I and Q components/phase as shown. The polarity for the correction signal can be determined based on which component is before the other.

In a top example, the I component is before/ahead of the Q component. As a result, $f_{VCO}$ is greater than $Nf_{REF}$.

In a bottom example, the Q component is before/ahead of the I component. As a result, the $f_{VCO}$ is less than the $Nf_{REF}$.

Figure 11:
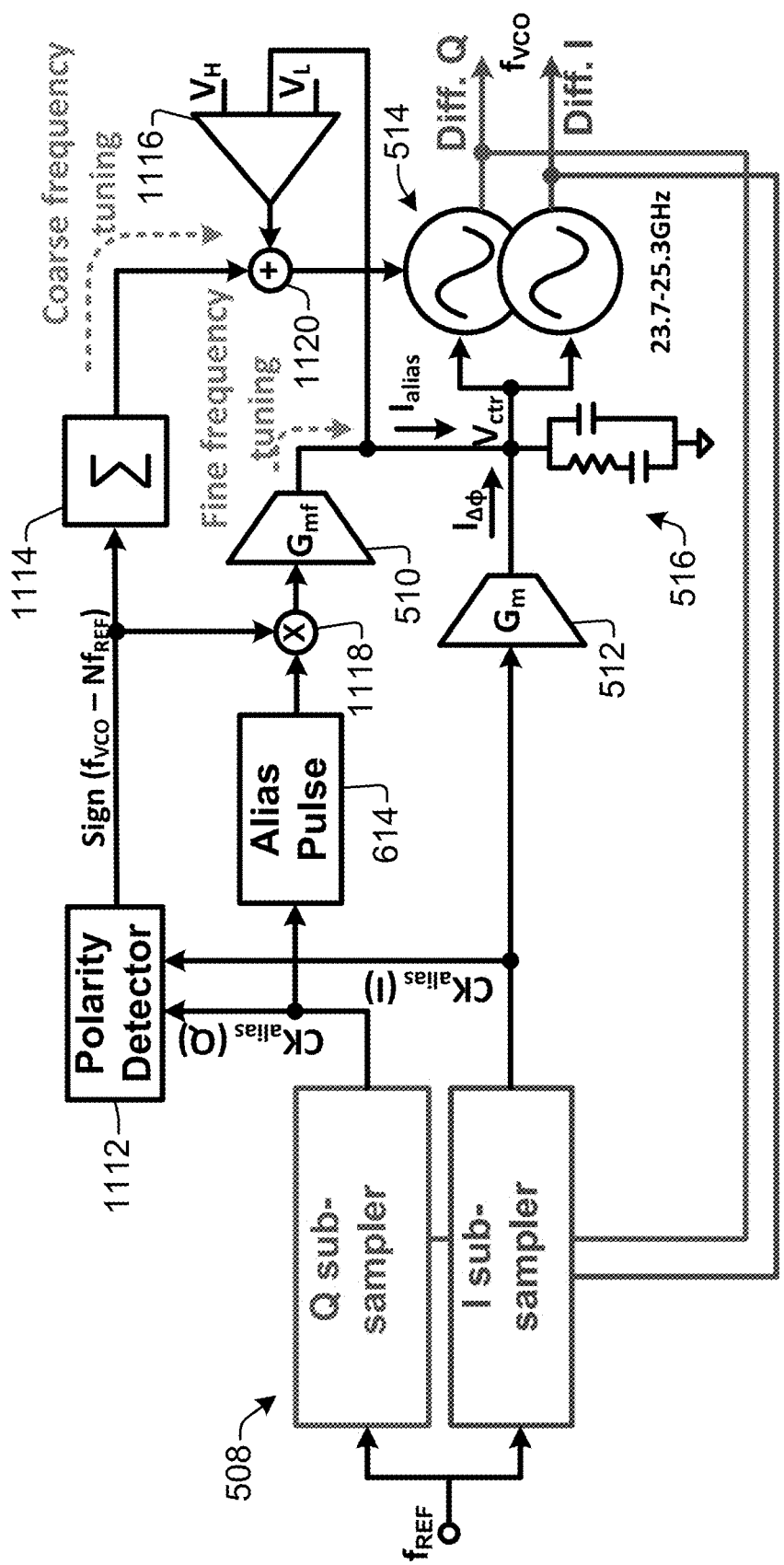
FIG. 11 illustrates the technique for coarse and fine frequency locking technique utilizing the polarity detector.

FIG. 11 is a diagram illustrating a sub-sampling phase locked loop (SSPLL) system 1100 in accordance with some embodiments. The system 1100 is similar to the system 500, described above, however the system 1100 utilizes Q and I components for polarity detection. Additional description for like numbered elements can be referenced by the above description of the system 500.

The system 1100 includes a sub-sampler 508, a polarity detector 1112, a pulse generator 614, a FLL gain circuit 510, a gain circuit 512, an analog filter 516, a summation circuit 1114, a combiner 1118, an adder circuit 1120, a tuning circuit 1116 and a VCO 514.

A FLL generally comprises the polarity detector 1112, the pulse generator 614, the summation circuit 1114, the tuning circuit 1116 and the FLL gain circuit 510. The tuning circuit 1116 is part of a coarse tuning loop that adjusts the VCO 514 over a wider frequency range.

In operation, the sub-sampler 508 differentially receives a reference frequency ($f_{REF}$) and a VCO frequency ($f_{VCO}$) and generates an alias frequency ($f_{alias}$) based on its inputs. The differential alias frequency is provided at its output.

A PLL gain circuit 512 generates a phase difference current $I_{\Delta\varphi}$ based on the alias frequency $f_{alias}$ and the reference clock $f_{REF}$. In one example, the phase difference current is based on only the I components.

A summation circuit, located between the gain circuit 512 and the VCO 514, combines the phase difference current $I_{\Delta\varphi}$ with the frequency correction current $I_{alias}$ to generate a tuning control signal or tuning voltage $V_{ctr}$.

The analog filter circuit 516 generates the tuning voltage $V_{ctr}$. In one example, the circuit 516 includes a first parallel path having a resistor and a first capacitor and a second parallel path having a capacitor. The values for the components of the circuit 516 can be selected to mitigate noise and the like on the tuning voltage $V_{ctr}$. It is appreciated that other suitable filter circuits and the like can be utilized in place of the circuit 516.

The VCO 514 generates a frequency output signal $f_{VCO}$ based on the tuning voltage $V_{ctr}$. In this example, the tuning voltage $V_{ctr}$ can be phase locked and frequency locked due to the phase difference current $I_{\Delta\varphi}$ and the frequency correction current $I_{alias}$. Thus, the output signal $f_{VCO}$ is phase locked and frequency locked without a divider being used in the system 500.

The FLL generates the frequency correction current $I_{alias}$. In operation, the differential polarity detector 1112 operates on the differential alias frequency and generates a sign based on which of the I and Q components are ahead of the other. Thus, the polarity detector 1112 generates a sign/signal based on the I and Q components. The generated polarity signal is combined with a pulse from the alias circuit 612 by combiner 1118. Its output is provided to the gain circuit 510 which generates at least a portion of the frequency correction current.

In one example, the polarity detector 1112 comprises a 1-bit phase detector. It is appreciated that the detector 1112 can include other suitable phase detectors and the like.

The polarity signal is also provided to the summation circuit 1114 which operates to perform a coarse tuning frequency. The VCO coarse frequency tuning is performed digitally with a binary weighted switched-capacitor arrays (inside VCO, not shown in the diagram).

An output of the summation circuit 1114 is combined with a tuning value by adder circuit 1120. The output of the adder circuit 1120 is provided to the VCO 514 as a coarse frequency adjustment.

The tuning value is generated by a tuning circuit 1116 based on VH and VL and the frequency correction current.

Figure 12:
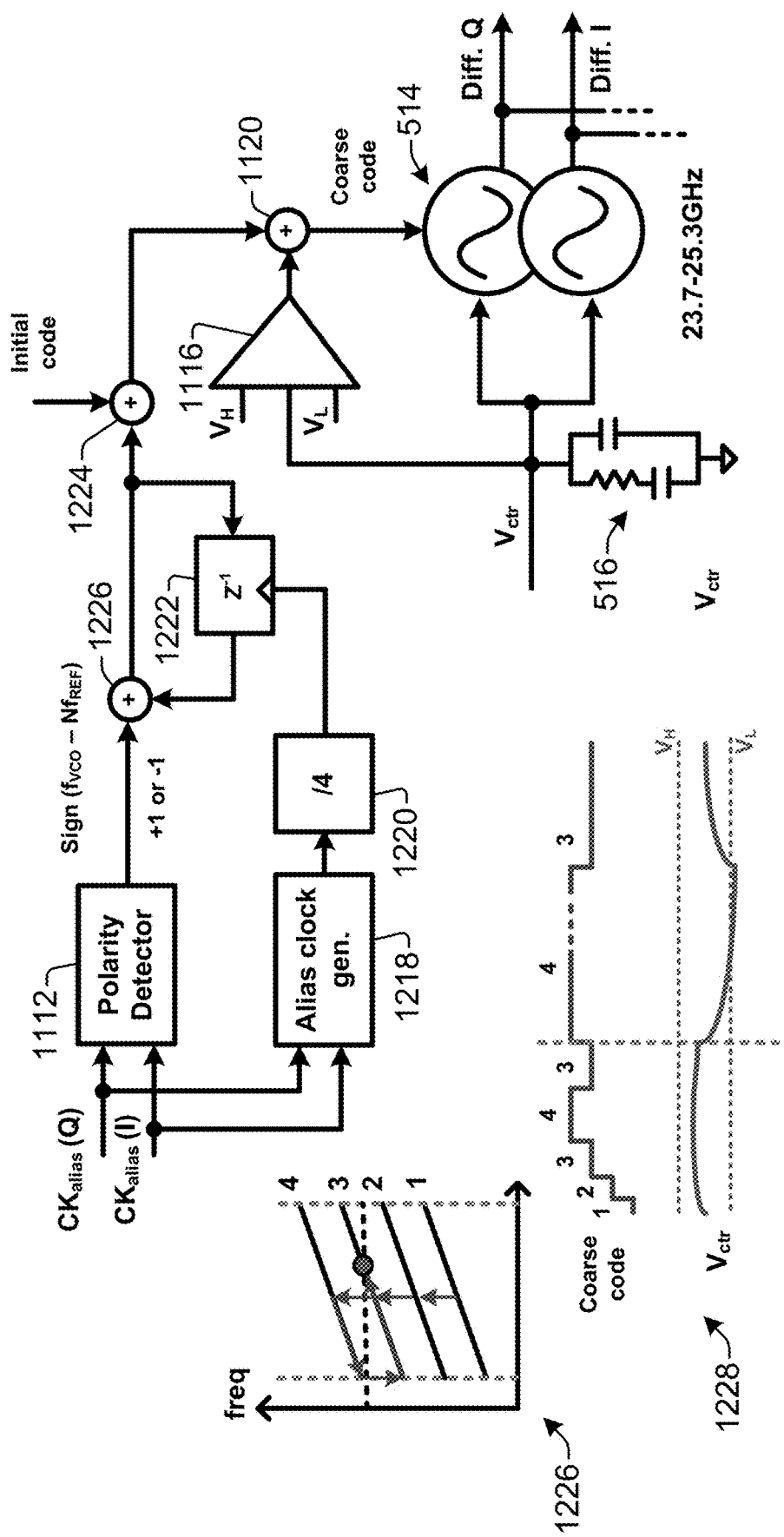
FIG. 12 illustrates of coarse frequency locking technique.

FIG. 12 is a diagram illustrating an arrangement for a sub-sampling phase locked loop (SSPLL) system 1200 in accordance with some embodiments and/or aspects. The system 1200 includes a frequency locked/locking loop (FLL) that facilitates wide frequency acquisition, including mmWave frequencies, while mitigating power consumption.

The system 1200 is similar to the system 1100 and includes additional details on the FLL.

In this example, the FLL also includes an alias clock generator 1218 and a frequency divider 1220.

The alias clock generator 1218 receives I and Q components/signals (alias frequency) from the sub-sampler and generates an alias clock. The divider 1220 divides the alias clock (by 4 in one example). The clock signal is used by integrator 1222, which integrates a polarity signal as an integrator output signal. The integrator output signal is combined with the polarity signal by adder circuit 1226 to generate a combined polarity signal.

A second adder circuit 1224 adds the combined polarity signal with an initial code to generate a code signal. The adder 1120 adds the code signal with a tuning signal to generate a coarse code.

The coarse code is provided to the VCO 514 for coarse frequency adjustments.

A first graph 1226 shows frequency adjustments by the coarse code.

A second graph 1228 depicts the VCO tuning voltage and VH and VL of the tuning circuit 1116 and compares them with example coarse codes ranging from 1, 2, 3 and 4.

Figure 13:
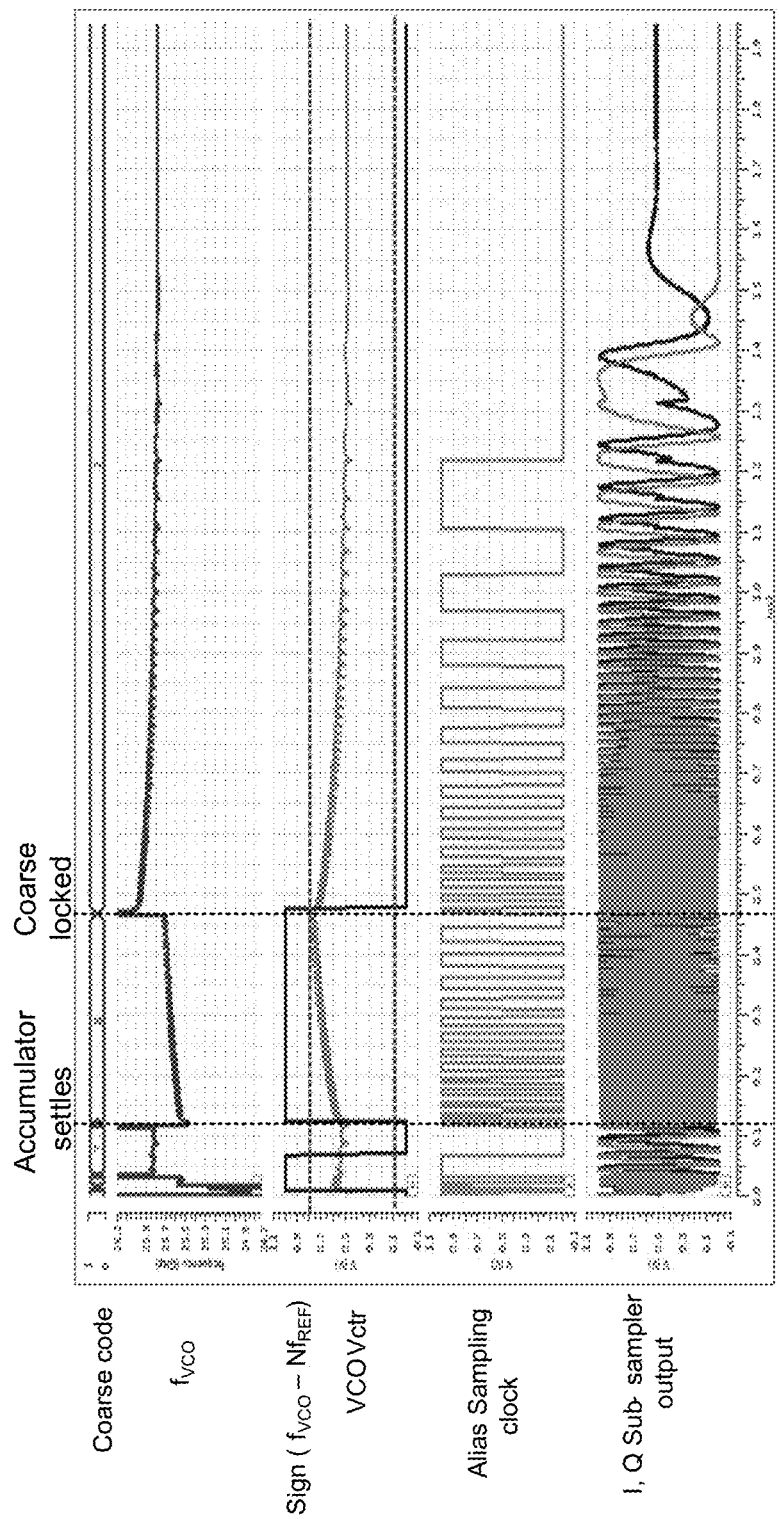
FIG. 13 depicts a graph showing example signals for the coarse and fine frequency locking in SSPLL.

FIG. 13 is a graph 1300 depicting example signals that can be used or generated with the system 1100 in accordance with some embodiments. The signals are provided for illustrative purposes and it is appreciated that variations and other signals are contemplated.

A y-axis depicts frequency or voltage as shown. An x-axis depicts time increasing from left to right.

A SSPLL, such as the system 1100, operates with various phases. A first phase is a coarse control phase. In this phase, the coarse control is seen changing until an accumulator (summation circuit) settles and the coarse is locked. Once locked, the coarse code is not changes and fine frequency tuning is performed until the frequency is settled. Once settled, the FLL is automatically deactivated.

It is appreciated that, as with the system 500, the FLL can automatically activated to adjust the frequency in response to frequency drift and the like.

It is appreciated that the above examples are provided for illustrative purposes and not to limit embodiments or aspects to specific shown values.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a sub-sampler phase locked loop (SSPLL) system having a frequency locking loop (FLL) and a phase locked loop (PLL). The FLL is configured to detect frequency variations between a phase locked loop (PLL) output signal and a reference frequency and automatically generate a pulsed correction signal upon the detected frequency variations and apply the pulsed correction signal to a voltage controlled oscillator (VCO) control voltage. The PLL is configured to generate the PLL output signal based on the VCO control voltage.

Example 2 includes the subject matter of Example 1, including or omitting optional elements, wherein the PLL comprises a sub-sampler configured to generate an alias frequency based on the reference frequency and the PLL output signal.

Example 3 includes the subject matter of any of Examples 1-2, including or omitting optional elements, wherein the PLL comprises a voltage controlled oscillator (VCO) configured to generate the PLL output signal based on the VCO control voltage.

Example 4 includes the subject matter of any of Examples 1-3, including or omitting optional elements, wherein the PLL is configured to apply a phase correction to the VCO control voltage.

Example 5 includes the subject matter of any of Examples 1-4, including or omitting optional elements, wherein the FLL comprises a polarity detector configured to determine and select a polarity for the pulsed correction signal.

Example 6 includes the subject matter of any of Examples 1-5, including or omitting optional elements, wherein the polarity detector comprises a counter configured to generate a plurality of count values based on an alias frequency and a digital circuit configured to determine the polarity based on the plurality of count values.

Example 7 includes the subject matter of any of Examples 1-6, including or omitting optional elements, wherein the polarity detector comprises a phase detector configured to determine the polarity based on I and Q phases/components.

Example 8 includes the subject matter of any of Examples 1-7, including or omitting optional elements, wherein the FLL comprises a coarse tuning loop configured to apply coarse frequency tuning to the pulsed correction signal.

Example 9 includes the subject matter of any of Examples 1-8, including or omitting optional elements, wherein the FLL comprises a frequency detector configured to detect frequency variations based on the PLL output signal and the reference frequency.

Example 10 includes the subject matter of any of Examples 1-9, including or omitting optional elements, wherein the FLL comprises a pulse generator configured to apply pulses to the correction signal based on rising edges of an alias frequency signal.

Example 11 includes the subject matter of any of Examples 1-10, including or omitting optional elements, wherein the FLL is automatically activated when there are detected frequency variations.

Example 12 includes the subject matter of any of Examples 1-11, including or omitting optional elements, wherein the FLL is automatically deactivated when there are no detected frequency variations.

Example 13 is a frequency locking loop (FLL) system comprising a pulse generator, a polarity detector and circuitry. The pulse generator is configured to generate a pulse signal based on a rail to rail signal, wherein the rail to rail signal is based on a reference frequency and an output signal. The polarity detector is configured to generate a polarity signal based on the rail to rail signal and a reference frequency. The circuitry configured to generate a frequency correction signal based on the pulse signal and the polarity signal.

Example 14 includes the subject matter of Example 13, including or omitting optional elements, further comprising a comparator configured to generate the rail to rail signal based on an alias frequency signal, wherein the alias frequency signal is based on the reference frequency and the output signal.

Example 15 includes the subject matter of any of Examples 13-14, including or omitting optional elements, further comprising a gain circuit configured to generate the frequency correction signal based on the polarity signal and the alias frequency signal.

Example 16 includes the subject matter of any of Examples 13-15, including or omitting optional elements, further comprising a second circuit configured to adjust a voltage controlled oscillator (VCO) control signal or voltage based on the frequency correction signal and the pulse signal.

Example 17 includes the subject matter of any of Examples 13-16, including or omitting optional elements, further comprising a voltage controlled oscillator (VCO) configured to generate the output signal based on the frequency correction signal and a phase correction signal.

Example 18 includes the subject matter of any of Examples 13-17, including or omitting optional elements, wherein the frequency correction signal is only generated in response to frequency drift of the output signal.

Example 19 includes the subject matter of any of Examples 13-18, including or omitting optional elements, further comprising a sub-sampler configured to generate an alias frequency signal having I and Q phases/components based on the reference frequency and the output signal.

Example 20 includes the subject matter of any of Examples 13-19, including or omitting optional elements, further comprising a coarse tuning loop configured to apply coarse tuning adjustments to the VCO.

Example 21 is a method of operating a sub-sampling phase locked loop (SSPLL) system. The method includes generating an alias frequency signal by sub-sampling a reference frequency and an output signal by a sub-sampler of a phase locked loop (PLL); determining whether there is frequency drift based on the alias frequency signal by a frequency locking loop (FLL); and automatically generating a frequency correction signal upon determining that there is frequency drift by the FLL.

Example 22 includes the subject matter of Example 21, including or omitting optional elements, further comprising adjusting the output signal based on the frequency correction signal by a circuit.

Example 23 includes the subject matter of any of Examples 21-22, including or omitting optional elements, further comprising adjusting the output signal based on a phase correction signal by the circuit.

Example 24 includes the subject matter of any of Examples 21-23, including or omitting optional elements, further comprising adjusting a coarse frequency of the output signal based on a coarse control loop of the FLL.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A sub-sampler phase locked loop (SSPLL) system comprising:
    a phase locked loop (PLL) configured to generate a PLL output signal based on a voltage controlled oscillator (VCO) control voltage, wherein the PLL comprises a sub-sampler configured to generate an alias frequency based on a difference between a frequency of the PLL output signal and a multiple N of a reference frequency;
    a frequency locking loop (FLL) configured to automatically generate a pulsed correction signal based on the alias frequency and combine the pulsed correction signal with a phase difference signal to generate the VCO control voltage.

2. The system of claim 1, wherein the PLL comprises a voltage controlled oscillator (VCO) configured to generate the PLL output signal based on the VCO control voltage.

3. The system of claim 1, wherein the PLL is configured to apply a phase correction to the VCO control voltage.

4. The system of claim 1, wherein the FLL comprises a polarity detector configured to determine and select a polarity for the pulsed correction signal.

5. The system of claim 4, wherein the polarity detector comprises a counter configured to generate a plurality of count values based on the alias frequency and a digital circuit configured to determine the polarity based on the plurality of count values.

6. The system of claim 4, wherein the polarity detector comprises a phase detector configured to determine the polarity based on I and Q phases/components.

7. The system of claim 1, wherein the FLL comprises a coarse tuning loop configured to apply coarse frequency tuning to the pulsed correction signal.

8. The system of claim 1, wherein the FLL comprises a frequency detector configured to detect frequency variations based on the PLL output signal and the reference frequency.

9. The system of claim 1, wherein the FLL comprises a pulse generator configured to apply pulses to the correction signal based on rising edges of an alias frequency signal.

10. The system of claim 1, wherein the FLL is automatically activated when there are detected frequency variations.

11. The system of claim 1, wherein the FLL is automatically deactivated when there are no detected frequency variations.

12. The system of claim 10, further comprising a sub-sampler configured to generate an alias frequency signal having I and Q phases/components based on the reference frequency and the output signal.

13. A method of operating a sub-sampling phase locked loop (SSPLL) system, the method comprising:
    generating an alias frequency signal by determining a difference between a multiple of a reference frequency and an output signal of a phase locked loop (PLL);
    determining whether there is frequency drift based on the alias frequency signal; and
    automatically generating a frequency correction signal upon determining that there is frequency drift by the FLL and combining the frequency correction signal and a phase difference signal to generate a voltage controlled oscillator (VCO) control voltage.

14. The method of claim 13, further comprising adjusting the output signal based on the frequency correction signal by a circuit.

15. The method of claim 13, further comprising adjusting the output signal based on a phase correction signal by the circuit.

16. The method of claim 13, further comprising adjusting a coarse frequency of the output signal based on a coarse control loop of the FLL.

* * * * *